United States Patent [19]

Arakelian et al.

[11] 4,130,765

[45] Dec. 19, 1978

[54] LOW SUPPLY VOLTAGE FREQUENCY MULTIPLIER WITH COMMON BASE TRANSISTOR AMPLIFIER

[76] Inventors: Rafi Arakelian, Khayam Ave., Lashgari St., Noubahar Junction #62, Shiraz, Iran; Michael M. Driscoll, 4823 W. Parkway, Baltimore, Md. 21229

[21] Appl. No.: 801,994

[22] Filed: May 31, 1977

[51] Int. Cl.² ............................................. H03B 19/10
[52] U.S. Cl. .................................. 307/220 R; 307/261; 307/354; 328/16; 307/295; 328/167
[58] Field of Search .................... 328/15, 38, 16, 20, 328/21, 22, 27, 150, 167; 307/354, 220, 261, 295

[56] References Cited

U.S. PATENT DOCUMENTS

| | | | |
|---|---|---|---|
| 3,213,293 | 10/1965 | Finlon et al. | 328/150 |
| 3,454,792 | 7/1969 | Horlander | 307/261 |
| 3,555,303 | 1/1971 | Kozawa | 328/15 X |
| 3,568,034 | 3/1971 | Shenfeld | 328/16 X |
| 3,571,627 | 3/1971 | Cardon et al. | 328/16 X |
| 3,610,956 | 10/1971 | Berlin et al. | 307/354 |
| 3,697,782 | 10/1972 | Matouka | 307/354 |

*Primary Examiner*—John S. Heyman
*Attorney, Agent, or Firm*—Cushman, Darby & Cushman

[57] ABSTRACT

A frequency multiplier circuit utilizing a zero-crossing detector for producing a square wave at the frenquency of the input signal to generate harmonics of the input frequency. The square wave is filtered to generate a signal of a predetermined harmonic.

24 Claims, 7 Drawing Figures

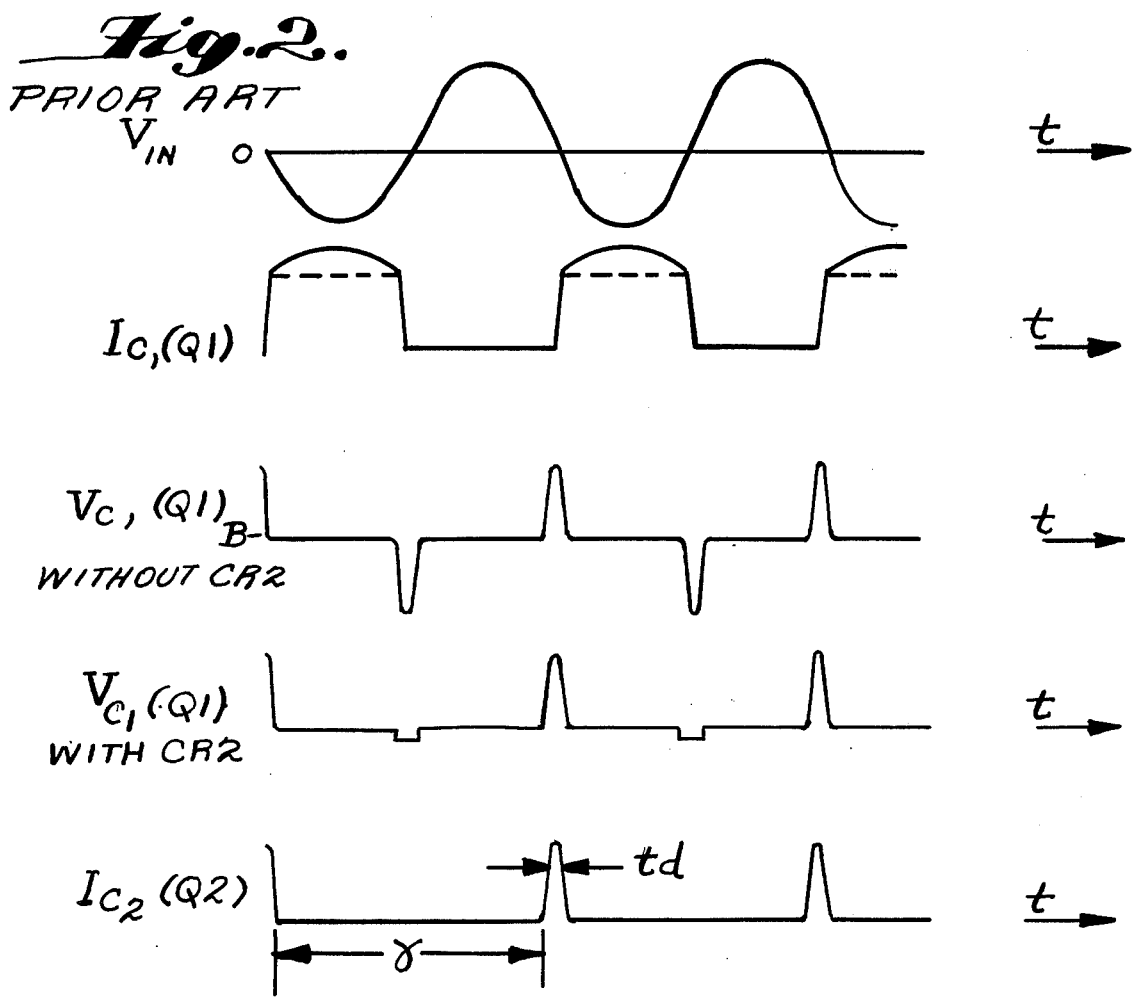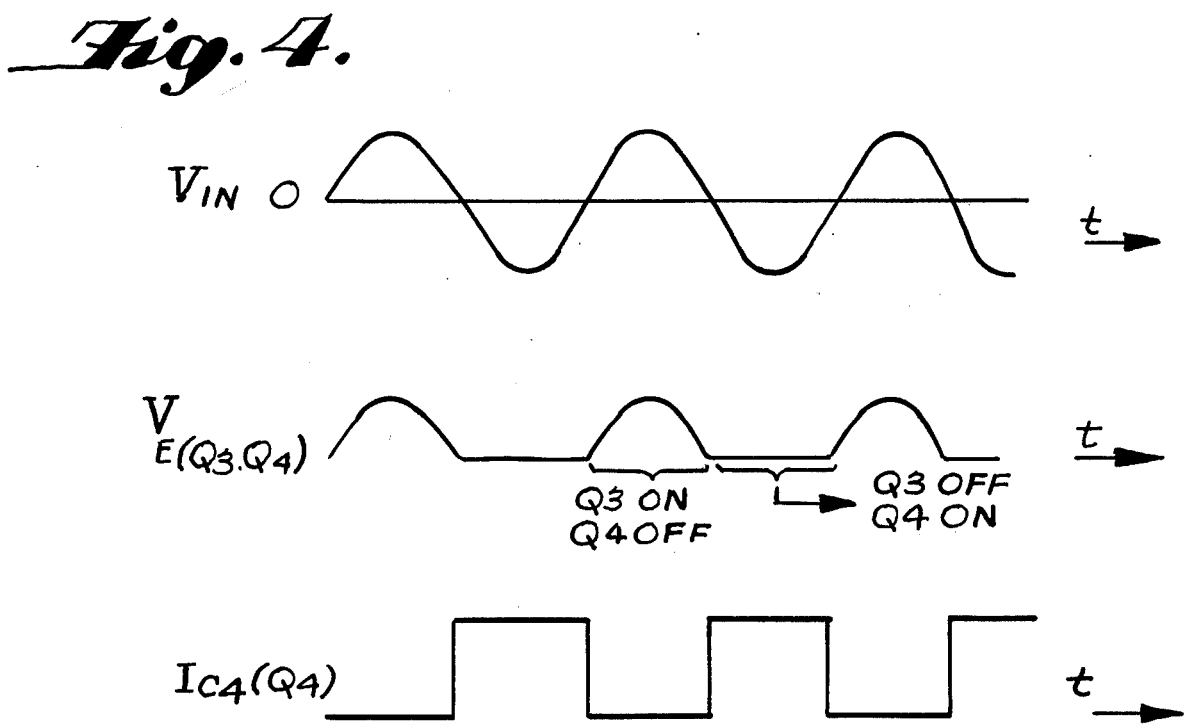

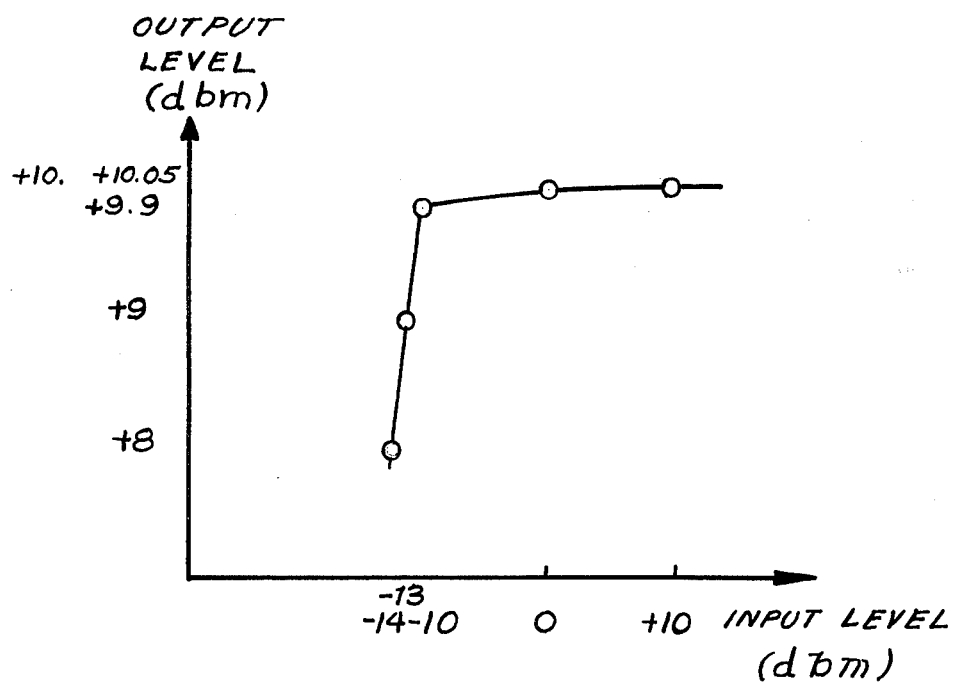

LOW SUPPLY VOLTAGE FREQUENCY MULTIPLIER WITH COMMON BASE TRANSISTOR AMPLIFIER

Frequency multiplication is an often-used technique in the production of stable, coherent continuous wave (CW) signals and for phase expansion of angular modulation in radar and communications systems. State of the art frequency multipliers generally utilize one or more of Class C transistor multipliers, variable capacitance (varactor) diodes, and step recovery (SRD) diodes. Class C transistor multipliers are disadvantageous in that they are typically sensitive to changes in transistor parameters and, further, since the production of harmonics is related to small values of signal conduction angle, are extremely sensitive to changes in drive level and transistor base-emitter potential. Multipliers utilizing varactor or SRD devices are disadvantageous in that they generally have relatively narrow bandwidths and tend to become unstable with drive and temperature variations. Further, SRD devices operate efficiently only at relatively high drive levels.

A frequency multiplier utilizing a zero-crossing switch and impulse generator is described in an article by R.A. Baugh, "Low Noise Frequency Multiplication", Proceedings, 26th Annual Symposium on Frequency Control, June, 1972, pps. 50–54. The Baugh circuit, however, as will be explained in detail below, requires a positive supply voltage which is large compared to the peak input signal voltage to prevent superimposing of portions of the input signal on the current pulse. Further, the resultant impulses contained both odd and even harmonics of the input frequency, generally requiring narrow band filter circuits at the circuit output. In addition, the Baugh circuit is not easily adapted to utilization of a single polarity low voltage supply.

The present invention is directed to a frequency multiplier utilizing a zero-crossing detector which can operate with relatively low voltage level supplies and insensitive input signal voltage level. Further, the voltage multiplier in accordance with the present invention is easily adapted for utilization with a single polarity supply, and is relatively stable and insensitive to transistor parameter variation.

Preferred embodiments of the present invention will be hereafter described with reference to the accompanying drawing, wherein like designations refer to like elements, and:

FIG. 2 is a diagram of various waveforms associated with the circuit of FIG. 1;

FIG. 4 is a diagram of various waveforms associated with the circuit of FIG. 3;

FIG. 5 is a schematic of a higher order frequency multiplier adapted for use with a single polarity voltage supply;

FIG. 7 is a graph of the amplitude modulation rejection characteristics of the circuit of FIG. 6.

Figure 1:
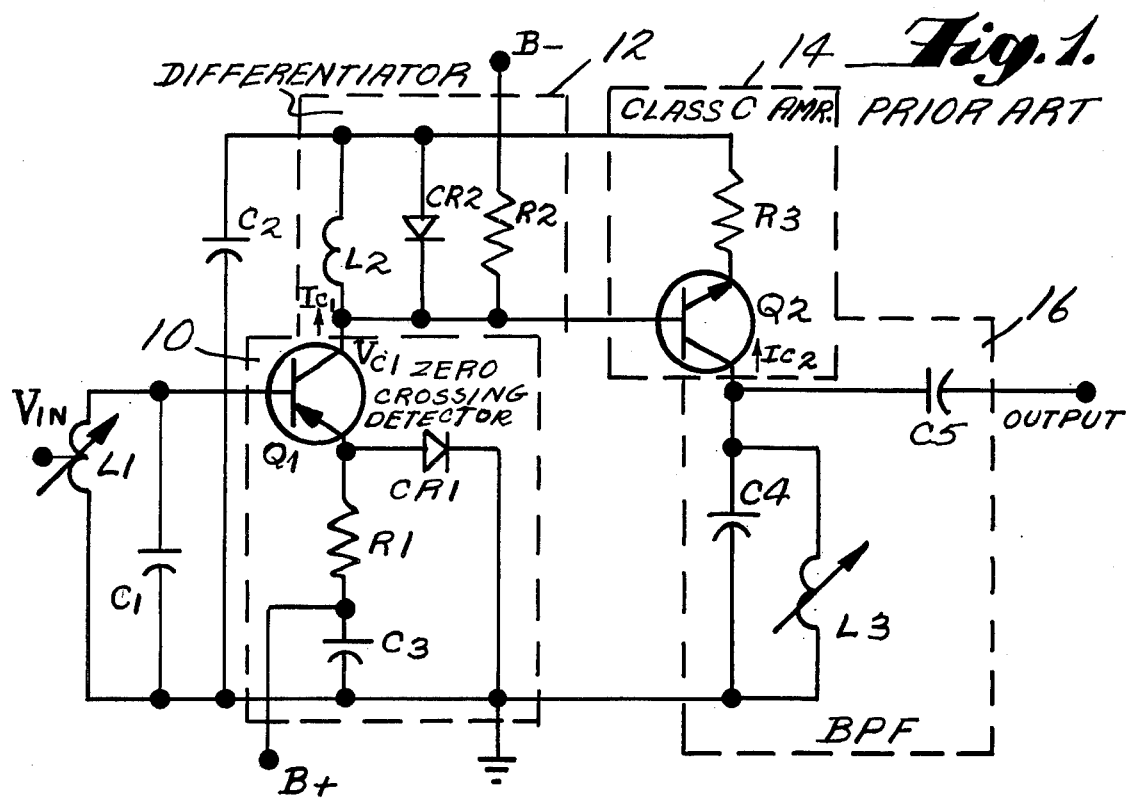
FIG. 1 is a schematic diagram of the prior art Baugh frequency multiplier.

An understanding of the present invention may best be facilitated by first describing in detail the aforementioned Baugh frequency multiplier. Referring now to FIGS. 1 and 2, an input signal, $V_{in}$, is applied via a tuned step-up transformer (L1,C1) to a zero-crossing detector 10. Zero-crossing detector 10 comprises a PNP type transistor Q1 connected in a common emitter manner with respect to AC signals, and a diode CR1 coupled between the emitter of transistor Q1 and ground potential. More particularly, the input signal is applied to the base, the emitter is connected to ground through an emitter resistor R1 and capacitor C3, and an output is taken from the collector of transistor Q1. Diode CR1 is coupled across resistor R1 and capacitor C3 to ground potential. A positive DC bias is applied to the emitter through emitter resistor R1.

Zero-crossing detector 10 generates output current pulses having transitions generally in accordance with zero-crossings in input signal $V_{in}$. The tuned transformer steps up input signal $V_{in}$ to, typically, 1 to 2 volts peak, developed across the relatively high base-to-ground impedance of transistor Q1. Transistor Q1 and diode CR1 operate as a current switch, alternately switching the current passing through emitter resistor R1 between Q1 and CR1 at the approximate zero-crossings of the input signal. When the emitter voltage of transistor Q1 drops below the contact potential of diode CR1, the diode is reverse biased and current flows through transistor Q1. Similarly, when the emitter voltage is greater than the contact potential of diode CR1, the diode is forward biased and current flows through diode CR1. At zero-crossings in the input waveform, the emitter voltage of transistor Q1 is substantially equal to the base-emitter contact potential VBE (approximately 0.6 volts for silicon transistor) and drops below VBE as the input waveform goes negative. Thus, if the contact potential of diode CR1 is identical to the base-emitter contact potential of transistor Q1, switching occurs at the zero-crossings of input signal $V_{in}$ with current flowing through transistor Q1 during the negative half-cycle and through diode CR1 during the positive half-cycle of the input signal. However, in practice, the contact potentials of transistor Q1 and diode CR1 differ by as much as 100 millivolts and, accordingly, switching occurs when the input signal voltage level exceeds ± 100 millivolts. In order to insure that such threshold level is reached in a minimum amount of time, the signal's voltage is made as large as possible without exceeding the reverse base-emitter rating of transistor Q1. Thus, zero-crossing detector 10 generates a current pulse having transitions at the zero-crossings of the input signal $V_{in}$. The waveform of the collector current ($I_{C1}$) is shown in FIG. 2.

Output signals from zero-crossing detector 10 are applied to a differentiator 12 and therefrom through a Class C amplifier 14 to a suitable band-pass filter 16. Differentiator 12 comprises an inductor L2, resistor R2 and diode CR2. Absent diode CR2, inductor L2 and resistor R2 would provide positive and negative going pulses in response to positive and negative going transitions, respectively, in collector current $I_{C1}$. Diode CR2 operates to substantially suppress the negative going pulses such that the reverse base-emitter voltage rating of transistor Q2 is not exceeded. The impulse trains, with and without diode CR2, are shown in FIG. 2. Class C amplifier 14 comprises an NPN transistor Q2, DC coupled to the collector of transistor Q1. The waveshape of the current $I_{C2}$ developed at the collector of transistor Q2 is also depicted in FIG. 2. Such collector current is a train of pulses of widths $t_D$ with a period τ equal to the period of the input frequency. Accordingly, the signal contains Fourier frequency components equal to harmonics of the input frequency. The signal, however, includes harmonic components having reasonably high level amplitudes up to the "nth" harmonic, where "n" is approximately equal to the period τ divided by twice the pulse width $t_D$. The desired harmonic is then extracted by bandpass filter 16, which also serves as an impedance matching network for coupling to the output.

It should be appreciated that, in the Baugh circuit, the negative half-cycle of the input signal $V_{in}$ (positive half-cycle for the case where Q1 is a NPN transistor) is superimposed on the current pulse output signal $I_{C1}$ of transistor Q1 unless the voltage across emitter resistor R1 is substantially larger than the input signal voltage. To minimize deleterious effects in circuit performance due to such superimposition, the positive supply voltage must, therefore, be made large as compared to the peak base-to-ground input signal voltage. Thus, since the input voltage level is requisitely large to provide accurate zero-crossing switching, the positive supply voltage must be substantial. Further, feedback between the collector and base transistor Q1 can cause further distortion of the signal as well as stability problems. This feedback occurs via the collector to base capacitance of Q1 and, because this capacitance varies inversely with collector base voltage, the degree of feedback increases substantially as the collector base voltage decreases. Accordingly, the voltage multiplier of FIG. 1 is disadvantageous for use with relatively low voltage supplies.

In addition, differentiator 12 has a bandwidth limiting effect on the circuit with regard to rejection requirements for adjacent harmonics. Accordingly, where an odd harmonic of the input frequency is the desired output, it would be desirable that zero-crossing detector 10 provide an output current approximating a symmetrical square wave containing only odd harmonics of the input frequency which could be amplified if desired and passed directly to the bandpass filter. However, the superimposition and feedback distortion in the Baugh circuit of FIG. 1 makes such an approach unfeasible. For example, where a 9-volt DC regulated supply is to be utilized and the input voltage has a peak value on the order of 1 to 2 volts, the voltage across transistor Q1 emitter resistor R1 is not substantially larger than the input voltage, resulting in significant disymmetry in the current waveform due to superimposition of the input half-cycle on current $I_{C1}$. The result of this superimposition is production of substantial even order harmonics. Further, feedback through transistor Q1 collector-base capacitance renders the Baugh circuit unsuitable for frequency in the VHF band or higher.

Figure 3:
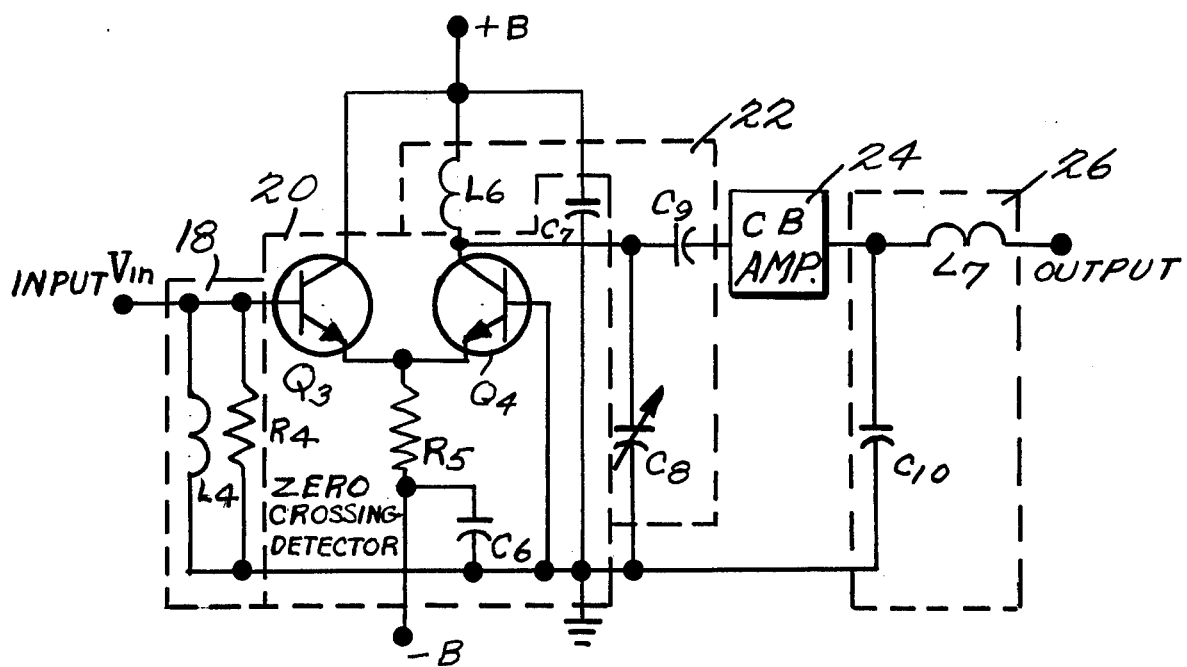
FIG. 3 is a schematic of a frequency multiplier in accordance with the present invention.

A frequency multiplier in accordance with the present invention is shown in FIG. 3. A dual polarity supply is shown for the sake of simplicity; circuits in accordance with the present invention utilizing a unipolar supply will be described in conjunction with FIGS. 5 and 6. Input signal $V_{in}$ is applied, suitably via a filter 18, to a zero-crossing detector 20. In accordance with the present invention, zero-crossing detector 20 comprises first and second transistors Q3 and Q4, respectively, connected in a common emitter manner and common base manner with respect to AC signals. Input signal $V_{in}$, as filtered, is applied to the base of transistor Q3. The emitter of transistor Q3 is connected at a common node with the emitter of transistor Q4, and connected therefrom through an emitter resistor R5 to a negative voltage supply. AC signals through emitter resistor R5 are bypassed to ground potential via capacitor C6. The collector of transistor Q3 is coupled to a positive bias supply and is AC bypassed to ground through a capacitor C7. The base of transistor Q4 is coupled to ground potential and the current at the collector thereof is utilized as the output of zero-crossing detector 20.

In operation, during positive half-cycles of input signals $V_{in}$, transistor Q3 is conductive and transistor Q4 is biased off. During the negative half-cycle, transistor Q3 is off and transistor Q4 is conductive. The emitter voltage $V_E$ at the common node, which ultimately controls conduction of transistor Q4 as will be explained, is directly dependent upon the emitter current of transistor Q3. Positive input signal levels forward bias the base-emitter junction of transistor Q3, causing the transistor to conduct. The emitter voltage reverse biases the emitter-base junction of transistor Q4, rendering it non-conductive during the positive half-cycle of the input signal. The emitter-base junction of transistor Q4 is forward biased when the emitter voltage drops below $V_{BE}$ of transistor Q4. At the zero-crossings of the input signal, $V_E$ is substantially equal to $V_{BE}$ of transistor Q3. Thus, if transistors Q3 and Q4 are matched and have substantially equal base-emitter contact potential, transistor Q4 is conductive during the negative half-cycles of the input signal. Thus, the current at the collector of transistor Q4 is substantially a square wave at the input frequency. The input voltage, emitter voltage ($V_E$) and collector current IC4 are shown in timed relation in FIG. 4.

It should be appreciated that, since the collector of input transistor Q3 is connected to AC ground and the output current pulses are produced by common base transistor Q4, the collector current IC4 of transistor Q4 is effectively isolated from the input waveform. That is, no input signal voltage appears at the emitter of transistor Q4 when Q3 is conducting (transistor Q3 is biased off) and, accordingly, the current pulses produced by transistor Q4 have no input signal superimposed. Thus, the collector current IC4 very closely approximates a symmetrical square wave having extremely small even harmonic content.

Further, the AC grounding of the collector of transistor Q3 and the base of transistor Q4 substantially eliminates feedback problems, even at frequencies in the VHF band and with small values of collector/emitter bias voltage. Thus, a relatively large output signal voltage can be developed at the collector of transistor Q4. It should also be appreciated that transistors Q3 and Q4 can be readily matched such that the base-emitter potentials are substantially equal, providing thereby faster rise and fall times in the output current pulses.

A desired odd harmonic, for example, the third harmonic, is extracted from the square wave by a filter 22 comprising an inductor L6 and capacitors C8 and C9, prior to further amplification by, for example, a common base amplifier 24. Since amplifier 24 has only to amplify the desired harmonic, rather than the entire square wave, a common base amplifier provides good output signal gain with reasonable efficiency and further provides good isolation. The output of amplifier 24 may be further filtered by a tuned circuit 26 comprising inductor L7 and capacitor C10. Filter 26 also operates to match the impedance of the multiplier circuit to the load.

It should be appreciated that the use of series capacitance C9 in tuned circuit 22 provides good low frequency (fundamental component) rejection and the use of series inductance in the second tuned circuit 26 provides a balanced amount of high frequency (5th, 7th, etc.) harmonic rejection. Simple single pole networks easily provide 50DB subharmonic and harmonic contents in the output signal. Multipole filter structures can, if desired, be utilized to provide better attenuation of undesired harmonics.

FIG. 5 shows a frequency multiplier in accordance with the present invention adapted for high order multiplication and further adapted to utilize a unipolar voltage source. Input signal $V_{in}$ is fed to the input transistor via bypass capacitor C11. Choke L8 provides signal isolation between transistor bases while allowing for identical base DC bias voltage. Biasing from a unipolar supply is provided by emitter resistor R5 and resistor R6 and R7. To adapt zero-crossing detector 20 for use with a unipolar supply, R5 is connected directly to ground, and the base of transistor Q4 is AC coupled to ground through a capacitor C12. A differentiator 12, such as that depicted in FIG. 1, is coupled to the collector of transistor Q4 to provide impulses in response to each positive going transition in the square wave output of zero-crossing detector 20. The impulse train from differentiator 12 is applied to a common base Class C amplifier 14a. A common base amplifier DC coupled to differentiator 12, is utilized to avoid collector-base capacitance effects. The amplified impulse train is passed to a load through a bandpass filter tuned to a desired harmonic. It should be appreciated that the circuit of FIG. 5 is not subject to the various disadvantages noted with respect to the prior art circuit of FIG. 1 and is operable at frequencies in the VHF band and with low supply voltages.

Figure 6:
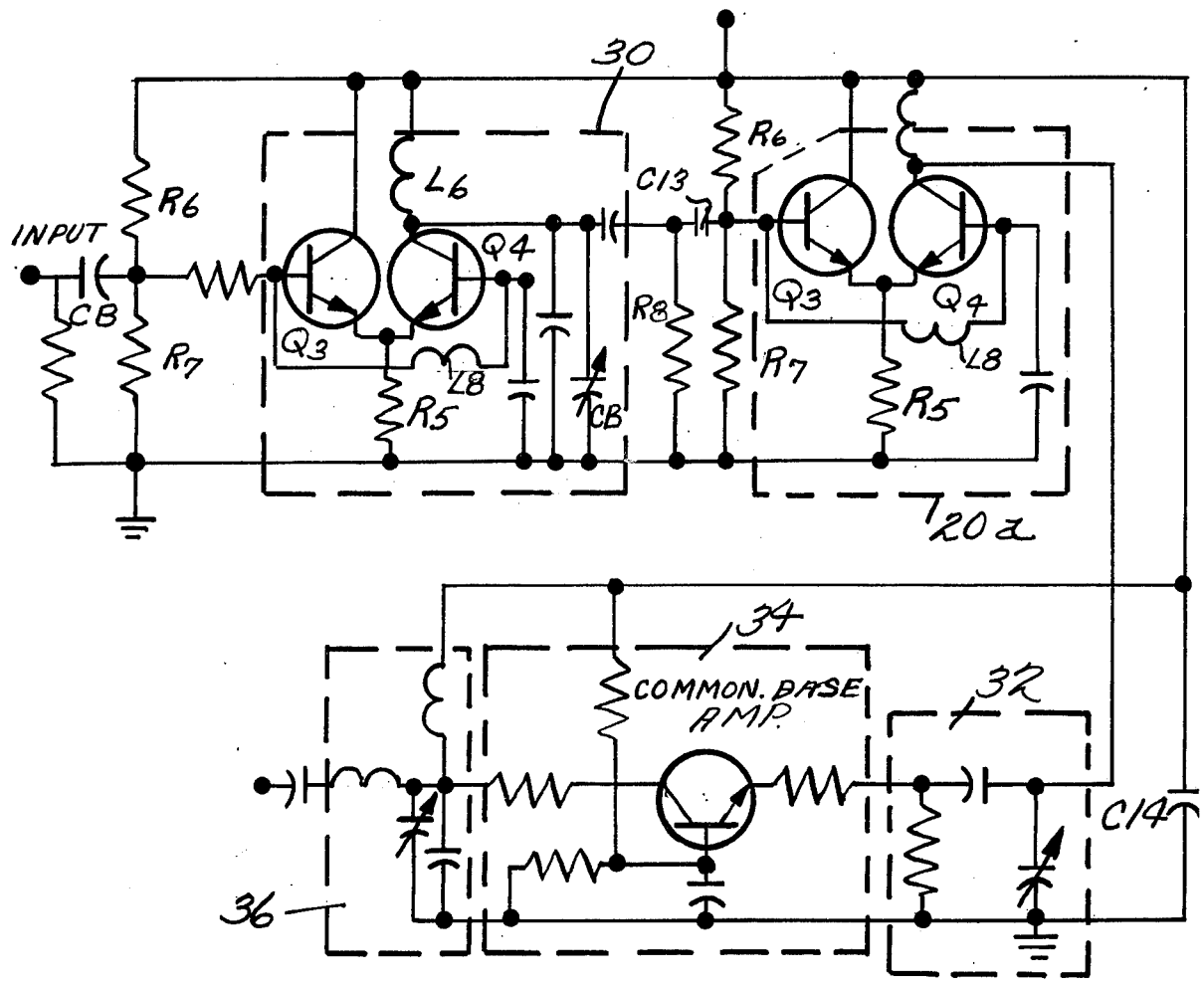
FIG. 6 is an alternative embodiment of a higher order frequency multiplier in accordance with the present invention.

Higher order multiplication can also be achieved by cascading lower order multipliers. For example, a "times 9" multiplier may comprise two frequency triplers of the type shown in FIG. 3. Such a multiplier, adapted for utilization with a unipolar supply, is shown in FIG. 6. The input signals $V_{in}$ are applied to a first zero-crossing detector 20 which generates a square wave at the input frequency as explained above. The square wave output from zero-crossing detector 20 is applied to a filter 30 which extracts the desired harmonic, for example, the third harmonic. The extracted harmonic is applied to a second zero-crossing detector 20a, which in turn provides a square wave of frequency equal to the harmonic frequency passed by filter 30. The square wave from zero-crossing detector 20a is applied to a further filter 32 to extract a desired harmonic thereof, for example, the third harmonic (the ninth harmonic of input signal $V_{in}$). The ninth harmonic is applied to a common base amplifier 34 and therefrom through a further filter 36 to the output. The circuit of FIG. 6 is, in effect, two voltage triplers of the type shown in FIG. 3 connected in cascade. The common base amplifier of the first tripler, however, is omitted since only a small signal level is required to operate the second tripler. Further, a single capacitor C14 is utilized to bypass the input transistor Q3 collector of both zero-crossing detectors 20 and 20a to ground potential. It should be noted that tuned circuit 30 need only equalize the zero-crossing time interval in the output of the first tripler, since all envelope distortion is removed by the zero-crossing detection of the second tripler.

Where a 9-volt regulated supply is used, the power output of such a circuit is nominally +10DBM, and the current drain approximately 30 milliamps. The input drive is on the order of zero-DBM, but it should be appreciated that the circuit can be operated at much lower drive levels by input matching to the high input impedance of the device. FIG. 7 shows the insensitivity to input level variation (AM rejection) of a circuit such as shown in FIG. 6 for "times 9" multiplication of a 14MHz signal (126MHz output).

It should be appreciated from the foregoing that the present invention provides a particularly advantageous low noise, low supply level frequency multiplier, operable in the VHF frequency band from a single low voltage supply. Such a frequency multiplier is particularly suited for use in battery operated mobile radio and other battery operated (remote repeater, etc.) equipment. It should also be appreciated that a frequency multiplier in accordance with the present invention presents low phase noise and is relatively insensitive to transistor parameter variations and, further, is not subject to the instability of multipliers utilizing, for example, varactor or SRD diodes. It will be understood that the above description is of illustrative embodiments of the present invention and that the invention is not limited to the specific form shown. Modifications may be made in the design and arrangement of the elements without departing from the spirit of the present invention, as will be apparent to those skilled in the art.

We claim:

1. In a circuit for generating an output signal having a frequency equal to a multiple of the frequency of an input signal applied thereto, said circuit being of the type including a zero-crossing detector for providing a signal having frequency components at harmonics of said input signal frequency, and a filter for passing only predetermined ones of said harmonics, the improvement wherein:

said zero-crossing detector comprises:

first and second transistors, each having first and second electrodes defining a conduction path therebetween, and a control electrode, current flow through said conduction path being in accordance with the voltage difference between said control electrode and said second electrode;

said input signal being applied to said first transistor control electrode;

said first transistor first electrode being AC bypassed to ground potential to prevent thereby feedback between said first transistor first and control electrodes;

said first and second transistor second electrodes being coupled to a common node;

said second transistor control electrode being AC coupled to ground potential; and said second transistor first electrode being coupled to said filter, to provide for, thereby, operation from relatively low supply voltages of said circuit at frequencies in the VHF range.

2. The circuit of claim 1 further including a common control electrode connected transistor amplifier coupled to said filter.

3. The circuit of claim 2 wherein said transistors are bipolar transistors and said first, second and control electrodes are respectively the collector, emitter and base.

4. The circuit of claim 1 wherein said transistors are bipolar transistors and said first, second and control electrodes are respectively the collector, emitter and base.

5. The circuit of claim 1 further including a differentiator circuit coupled between said second transistor first electrode and said filter.

6. The circuit of claim 1 further including an AC choke inductor coupled between the respective control electrodes of said first and second transistors to provide AC signal isolation between said respective control electrodes while maintaining said respective control electrodes at identical voltages.

7. A circuit for generating an output signal having a frequency equal to a predetermined multiple of the frequency of an input signal applied thereto, said circuit being capable of generating said output signal in the VHF range and comprising:
   first and second transistors, each having first and second electrodes defining a conductor path therebetween, and a control electrode, current flow through said conduction path being in accordance with the difference in potential between said second and control electrodes;
   said first transistor being connected in a common second electrode manner with respect to said input signal, and being receptive of a signal indicative of said input signal at the control electrode thereof;
   said second transistor being connected in a common control electrode manner with respect to said input signals, said second transistor second electrode being coupled to the first transistor second electrode; and
   a filter circuit, responsive to signals from said second transistor first electrode, for passing only signals having frequencies within predetermined limits from said multiple frequency.

8. The circuit of claim 7 further including a common control electrode connected transistor amplifier, receptive of signals from said filter.

9. The circuit of claim 8 wherein said transistors are bipolar transistors and said first, second and control electrodes are, respectively, the collector, emitter and base.

10. The circuit of claim 7 wherein said transistors are bipolar transistors and said first, second and control electrodes are, respectively, the collector, emitter and base.

11. The circuit of claim 10 wherein said first transistor collector is AC bypassed to ground potential.

12. The circuit of claim 7 wherein said first transistor first electrode is AC bypassed to ground potential.

13. The circuit of claim 7 further including a differentiator circuit coupled between said second transistor first electrode and said filter.

14. The circuit of claim 7 adapted to provide a further multiple of said input signal frequency, said circuit including:
   third and fourth transistors, each having first and second electrodes defining a conductor path therebetween, and a control electrode, current flow through said conduction path being in accordance with the difference in potential between said second and control electrodes;
   said third transistor being connected in a common second electrode manner with respect to said input signal, and being receptive of a signal from said filter circuit at the control electrode thereof;
   said fourth transistor being connected in a common control electrode manner with respect to said input signal, said second transistor second electrode being coupled to said third transistor second electrode; and
   a further filter circuit, responsive to signals from said fourth transistor first electrode, for passing only signals having frequencies within predetermined limits of said further multiple frequency.

15. The circuit of claim 14 further including a common control electrode connected transistor amplifier, responsive to signals passed by said further filter circuit.

16. The circuit of claim 7 further including an C choke inductor coupled between the respective control electrodes of said first and second transistors to provide AC signal isolation between said respective control electrodes while maintaining said respective control electrodes at identical voltages.

17. In a circuit for generating an output signal having a frequency equal to a predetermined multiple of the frequency of an input signal applied thereto, comprising:
   first and second and third transistors, each having first and second electrodes defining a conduction path therebetween, and a control electrode, current flow through said conduction path being in accordance with the voltage difference between said control electrode and said second electrode;
   said input signal being applied to said first transistor control electrode, said first and second transistor second electrodes being coupled to a common node, said second transistor control electrode being AC coupled to ground potential;
   a differentiator circuit responsive to signals from said second transistor first electrode; and
   a filter circuit, responsive to signals from said differentiator circuit for passing only signals having frequencies within predetermined limits of said predetermined multiple.

18. The circuit of claim 17 wherein said first transistor first electrode is AC bypassed to ground potential to prevent thereby feedback between said first transistor first and control electrodes.

19. The circuit of claim 18 wherein said transistors are bipolar transistors and said first, second and control electrodes are, respectively, the collector, emitter and base.

20. The circuit of claim 17 wherein said transistors are bipolar transistors and said first, second and control electrodes are, respectively, the collector, emitter and base.

21. A circuit for generating an output signal having a frequency equal to a predetermined multiple of the frequency of the input signal applied thereto comprising:
   a differential transistor pair current switch, responsive to zero-crossings in said input signal, for passing current alternately to one of two paths;
   a common base amplifier circuit, responsive to current in one of said alternate current paths;
   a filter circuit, responsive to signals from said amplifier circuit, for passing only signals having frequencies within predetermined limits of said predetermined multiple frequency.

22. The circuit of claim 21 wherein said current switch and said voltage amplifier comprise first and second transistors, respectively, each of said transistors having first and second electrodes defining a current path therebetween and a control electrode, current flow in said channel being in accordance with the potential difference across said control and second electrodes.

23. The circuit of claim 22 wherein said input signal is applied to said first transistor control electrode;

said first and second transistor electrodes are coupled to a common node;

said second transistor control electrode is AC coupled to ground potential; and said second transistor first electrode is coupled to said filter.

24. The circuit of claim 22 wherein said first transistor first electrode is AC bypassed to ground potential to prevent thereby feedback between said first transistor first and control electrodes.

* * * * *